(12) United States Patent
Sugai

(10) Patent No.: US 8,305,765 B2
(45) Date of Patent: Nov. 6, 2012

(54) ELECTRONIC APPARATUS

(75) Inventor: Takahiro Sugai, Kokubunji (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/027,883

(22) Filed: Feb. 15, 2011

(65) Prior Publication Data

US 2012/0026712 A1 Feb. 2, 2012

(30) Foreign Application Priority Data

Jul. 30, 2010 (JP) ................................ 2010-172736

(51) Int. Cl.
*H05K 7/00* (2006.01)

(52) U.S. Cl. ........ 361/760; 361/752; 361/796; 361/807; 439/65; 174/259

(58) Field of Classification Search .................. 361/760, 361/752, 796, 807; 174/259, 263, 541, 520, 174/535, 50.52, 50.53; 439/65
See application file for complete search history.

(56) References Cited

U.S. PATENT DOCUMENTS

| | | | | |
|---|---|---|---|---|
| 6,580,159 B1* | 6/2003 | Fusaro et al. | ................. | 257/668 |
| 6,911,606 B2* | 6/2005 | Suda | ............................. | 174/259 |
| 2003/0079896 A1* | 5/2003 | Matani et al. | ................. | 174/52.4 |
| 2003/0223204 A1* | 12/2003 | Tandai | ........................... | 361/767 |
| 2008/0173468 A1* | 7/2008 | Hara | ............................. | 174/254 |
| 2010/0328904 A1* | 12/2010 | Takizawa et al. | ............. | 361/749 |

FOREIGN PATENT DOCUMENTS

| | | |
|---|---|---|
| JP | 61-104581 | 7/1986 |
| JP | 2-222599 | 9/1990 |
| JP | 7-226421 | 8/1995 |
| JP | 2001-332846 | 11/2001 |
| JP | 2004-247551 | 9/2004 |
| JP | 2005-268521 | 9/2005 |

OTHER PUBLICATIONS

Japanese Patent Application No. 2010-172736, Notification of Office Action, mailed May 6, 2011, (with English Translation).

* cited by examiner

*Primary Examiner* — Hoa C Nguyen
(74) *Attorney, Agent, or Firm* — Blakely, Sokoloff, Taylor & Zafman LLP

(57) ABSTRACT

According to one embodiment, an electronic apparatus includes a housing, a signal wiring and an electronic component. The signal wiring is provided on a first surface which is an inner surface of the housing. The electronic component is accommodated in the housing and includes a conductive member for electrical continuity with the signal wiring. The conductive member is formed on a surface of the electronic component facing the first surface of the housing. The electronic component is fixed to the first surface of the housing by a conductive adhesive agent having conductivity so that the conductive member has electrically continuity with the signal wiring. The electronic component is fixed to the first surface of the housing by a reinforcing adhesive agent having adhesive strength higher than the conductive adhesive agent.

15 Claims, 4 Drawing Sheets

ELECTRONIC APPARATUS

CROSS REFERENCE TO RELATED APPLICATION(S)

This application is based upon and claims the benefit of priority from Japanese Patent Application No. 2010-172736 filed on Jul. 30, 2010, the entire contents of which are incorporated herein by reference.

FIELD

Embodiments described herein relates generally to an electronic apparatus.

BACKGROUND

Regarding electronic apparatuses where portability is important such as portable computers, there is a demand that the housing as casing be slim and compact.

To realize the slimming of the housing, the wiring pattern is integrally formed with the housing by printing a conductive adhesive agent on the inner surface of the housing, and an electronic component such as a connector is bonded to the land portions of the wiring pattern.

According to this structure, the wiring pattern and the electronic component can be electrically connected by using the conductive adhesive agent forming the wiring pattern. Consequently, housing size reduction and space saving can be achieved.

In the housing, the wiring pattern formed integrally with the housing and a conductive member for electrical connection with the wiring pattern in an electronic component such as a connector are electrically connected by the conductive adhesive agent to be physically fixed.

However, the conductive adhesive agent is weak in adhesive strength, and when the housing and the electronic component are fixed only by the conductive adhesive agent, the reliability of fixing can be low.

BRIEF DESCRIPTION OF THE SEVERAL VIEWS OF THE DRAWINGS

A general configuration that implements the various features of the invention will be described with reference to the drawings. The drawings and the associated descriptions are provided to illustrate embodiments of the invention and not to limit the scope of the invention.

DETAILED DESCRIPTION

In general, according to one embodiment, an electronic apparatus includes a housing, a signal wiring and an electronic component. The signal wiring is provided on a first surface which is an inner surface of the housing. The electronic component is accommodated in the housing and includes a conductive member for electrical continuity with the signal wiring. The conductive member is formed on a surface of the electronic component facing the first surface of the housing. The electronic component is fixed to the first surface of the housing by a conductive adhesive agent having conductivity so that the conductive member has electrically continuity with the signal wiring. The electronic component is fixed to the first surface of the housing by a reinforcing adhesive agent having adhesive strength higher than the conductive adhesive agent.

Various embodiments will be hereinafter described with reference to FIGS. 1 to 6.

First Embodiment

Figure 1:
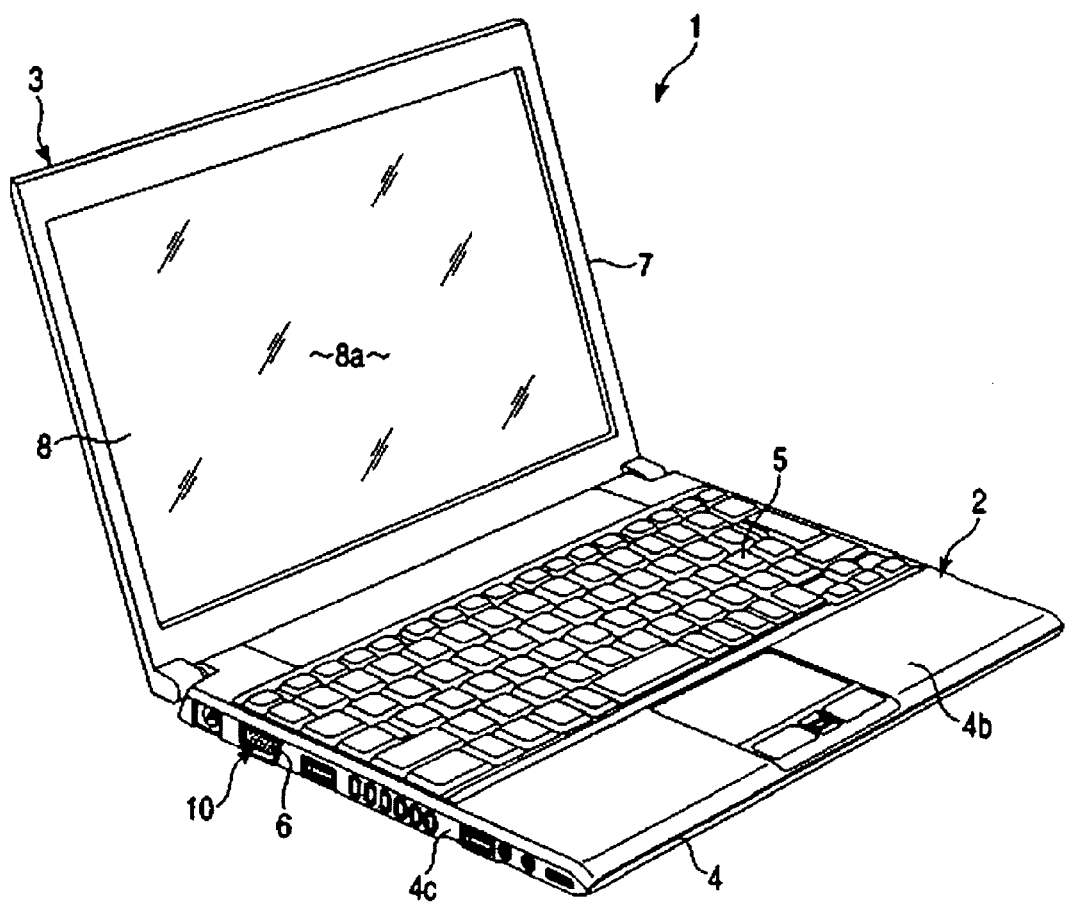
FIG. 1 is an exemplary perspective view of a portable computer according to a first embodiment.

FIG. 1 discloses a portable computer 1 as an example of the electronic apparatus. The portable computer 1 includes a computer main body 2 and a display module 3.

The computer main body 2 is provided with a housing 4. The housing 4 is made of, for example, a synthetic resin material, and has electrical insulation property. The housing 4 has a flat box shape having a bottom wall 4a, an upper wall 4b and a side wall 4c. The upper wall 4b of the housing 4 supports a keyboard 5. The side wall 4c uprises from the side edges of the bottom wall 4a. A quadrilateral opening 6 is provided in the side wall 4c of the housing 4.

As shown in FIG. 1, the display module 3 is provided with a display housing 7 and a liquid crystal display panel 8 accommodated in the display housing 7. The display housing 7 has a flat box shape having substantially the same size as that of the computer main body 2. The liquid crystal display panel 8 has a screen 8a displaying image information and character information. The screen 8a is exposed from the front surface of the display housing 7.

The display module 3 is supported at the rear end portion of the computer main body 2 through non-illustrated hinges. Consequently, the display module 3 is pivotable between a closed position where it lies down on the computer main body 2 so as to cover the keyboard 5 and an opened position where it uprises from the rear end portion of the computer main body 2 so that the keyboard 5 and the screen 8a are exposed.

Figure 2:
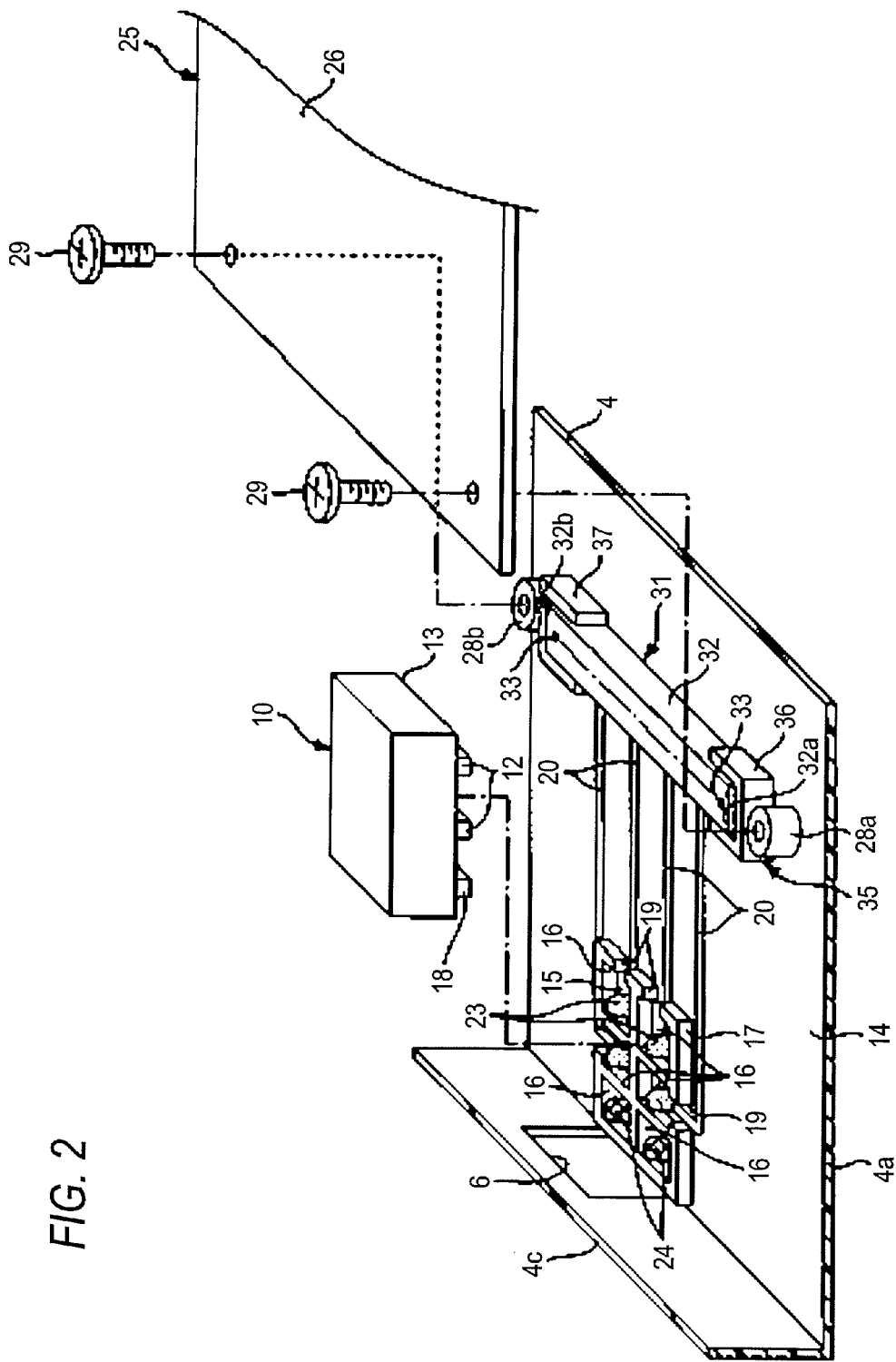
FIG. 2 is an exemplary exploded perspective view showing a positional relationship between a housing provided with multiple signal wirings and multiple adhesive filling portions and a connecter having connection terminals according to the first embodiment.

As shown in FIGS. 1 and 2, a connector 10 is disposed at the opening 6 of the side wall 4c. The connector 10 is an electronic component for connecting a peripheral apparatus such as an external monitor (not shown). The connector 10 has multiple connection terminals 12 and a reinforcing pin 18. The connection terminals 12 and the reinforcing pin 18 are arranged in a matrix form on a flat lower surface 13 of the connector 10. The connection terminals 12 protrude from the connector 10, and are electrically connected to signal wirings 20 as conductive members. The reinforcing pin 18 protrudes from the connector 10, and reinforces the fixing between the connector 10 and the housing 4. The reinforcing pin 18 is provided on a side closer to the opening 6 than the connection terminals 12 in the connector 10 disposed inside the housing 4.

The connector 10 is supported on an inner surface 14 which is a first surface of the bottom wall 4a of the housing 4. The inner surface 14 of the housing 4 has a connector mounting area 15. The connector mounting area 15 is an area for fixing the connector 10 to the housing 4, and adjoins the opening 6.

Figure 3:
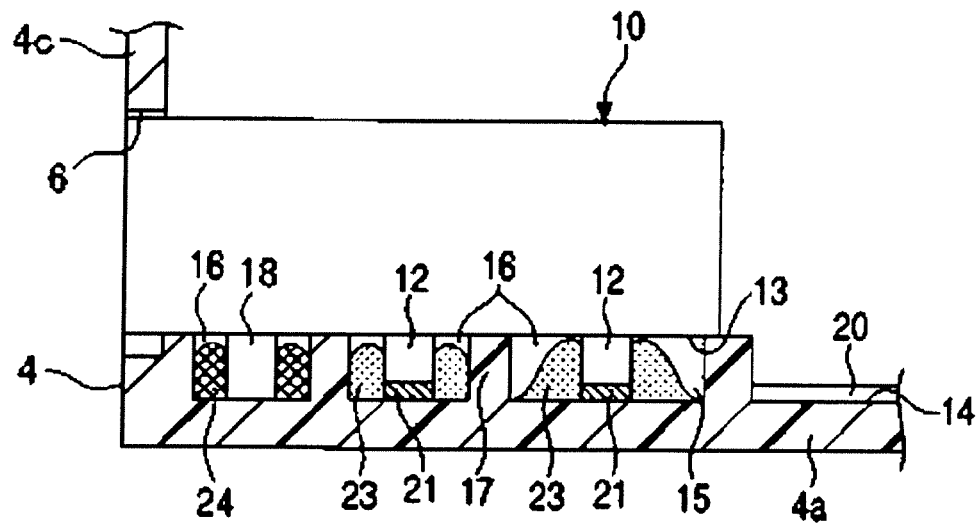
FIG. 3 is an exemplary sectional view showing a state the connector is bonded to a connector mounting area of the housing.
Figure 4:
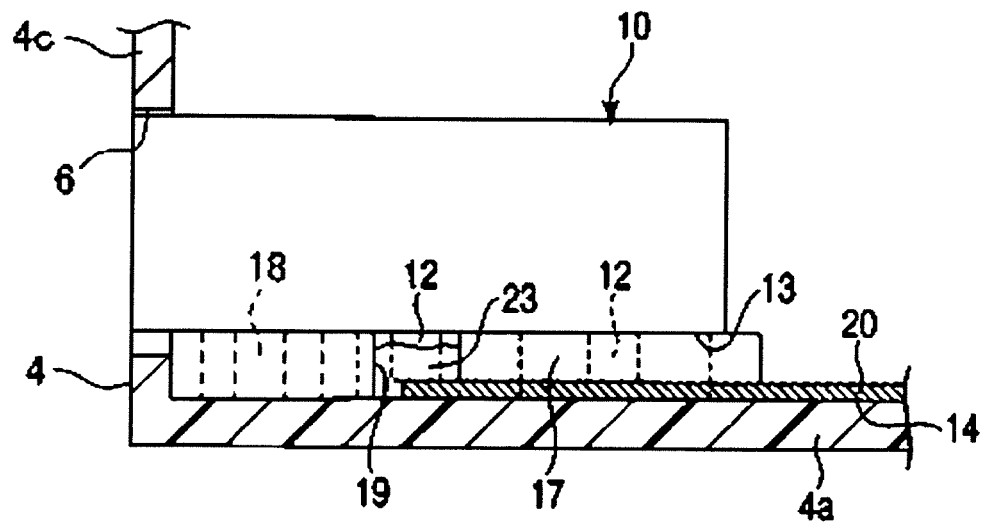
FIG. 4 is an exemplary sectional view showing a positional relationship between the housing provided with the multiple signal wirings and the multiple adhesive filling portions and the connecter having the connection terminals according to the first embodiment.

As shown in FIGS. 2 to 4, multiple adhesive filling portions 16 are provided in the connector mounting area 15. The adhesive filling portions 16 are partitioned in a grid form by a partitioning wall 17 so as to correspond to the connection terminals 12 and the reinforcing pin 18 of the connector 10. The partitioning wall 17 has a rib form protruding from the inner surface 14 of the bottom wall 4a toward the inside of the housing 4, and surrounds the adhesive filling portions 16. The adhesive filling portions 16 are opened toward the upside of the bottom wall 4a, and have a shape larger than the connection terminals 12 and the reinforcing pin 18 of the connector 10.

The partitioning wall 17 is provided with multiple wiring lead-in portions 19. The wiring lead-in portions 19 have a slit form opened to the adhesive filling portions corresponding to the connection terminals 12 of the connector 10. In the positions corresponding to the wiring lead-in portions 19, the inner surface 14 of the bottom wall 4a is exposed.

As shown in FIG. 2, multiple signal wirings 20 are integrally formed on the inner surface 14 of the bottom wall 4a. The signal wirings 20 are constructed by applying a conductive adhesive agent in a line form to the inner surface 14 of the bottom wall 4a. The signal wirings 20 extend in the direction of the width of the housing 4, and are spaced parallel to each other. As a method of applying the conductive adhesive agent to the inner surface of the bottom wall 4a, for example, a screen printing method or a dispense method can be used.

One ends of the signal wirings 20 individually enter the adhesive filling portions 16 accommodating the connection terminals 12 of the connector 10 from the wiring lead-in portions 19. At one ends of the signal wirings 20, lands 21 as shown in FIG. 3 are provided. The lands 21 are situated at the bottom of the adhesive filling portions 16 corresponding to the connection terminals 12 of the connector 10.

As shown in FIGS. 3 and 4, the connector 10 is superposed on the partitioning wall 17. The lower surface 13 of the connector 10 closes the opened ends of the adhesive filling portions 16 from above. Thereby, the connection terminals 12 of the connector 10 enter the adhesive filling portions 16 to be laid on the lands 21. The reinforcing pin 18 also enters the adhesive filling portions 16, and is situated so as to be in contact with the inner surface 14 of the bottom wall 4a in the adhesive filling portions 16.

The adhesive filling portions 16 where the connection terminals 12 of the connector 10 enter are filled with a conductive adhesive agent 23. The adhesive filling portion 16 where the reinforcing pin 18 of the connector 10 enters is filled with a reinforcing adhesive agent 24. The conductive adhesive agent 23 has higher conductivity than the reinforcing adhesive agent 24, and is an adhesive agent in which, for example, an epoxy adhesive agent is mixed with a metal such as silver. While the conductive adhesive agent 23 is an epoxy adhesive agent as an example in the present embodiment, an acrylic adhesive agent, a polyester adhesive agent or the like is considered as well, and the present invention is not limited thereto. The reinforcing adhesive agent 24 has stronger adhesive strength than the conductive adhesive agent 23, and in the present embodiment, is an epoxy adhesive agent as an example. In the general connector fixing, in many cases, the connection terminals and the reinforcing pin are all connected by soldering; however, in the present embodiment, the connection terminals and the reinforcing pin are bonded by different materials according to their respective uses.

The conductive adhesive agent 23 is cured in a state of integrally covering the connection terminals 12 and the lands 21. The reinforcing adhesive agent 24 is cured in a state of integrally covering the reinforcing pin 18 and the inner surface 14. The conductive adhesive agents 32 filled in the adjoining adhesive filling portions 16 are held in a state of being electrically insulated from each other by the partitioning wall 17. Consequently, the connector 10 is fixed to the connector mounting area 15 of the housing 4 through the conductive adhesive agent 23, and the connection terminals 12 of the connector 10 are held in a state of being electrically connected to the lands 21 of the signal wirings 20. The connector 10 is bonded to the housing 4 through the reinforcing adhesive agent 24 with high adhesive strength.

As shown in FIG. 2, the other ends of the signal wirings 20 opposite to the lands 21 are directed in a direction away from the connector mounting area 15, and are spaced in a line on the inner surface of the bottom wall 4a.

Further, a printed circuit board 25 is accommodated in the housing 4. The printed circuit board 25 has a circuit board 26 and multiple pads (not shown) formed at one end of the lower surface of the circuit board 26. These pads are an example of terminal portions having electrically continuity with the conductive pattern of the printed circuit board 25, and are spaced in a line so as to correspond to the other ends of the signal wirings 20.

One end of the circuit board 26 is fixed onto a pair of boss portions 28a and 28b protruding from the inner surface 14 of the bottom wall 4a, through screws 29 as fixing members. The circuit board 26 is disposed parallel to the inner surface 14 of the bottom wall 4a.

The pads of the circuit board 26 face the other ends of the signal wirings 20. The pads and the other ends of the signal wirings 20 are electrically connected together.

Next, a procedure for connecting the housing 4 and the connector 10 will be described.

First, the conductive adhesive agent 23 is supplied to the connection terminals 12 of the connector 10 and the lands 21 by printing or a dispenser.

Then, the reinforcing adhesive agent 24 is supplied to the reinforcing pin 18 of the connector 10 and the inner surface 14 of the bottom wall 4a in the adhesive filling portions 16 by printing or a dispenser.

After the supply of the conductive adhesive agent 23 and the reinforcing adhesive agent 24, the connector 10 is mounted in the corresponding position in the housing 4.

After the mounting, the conductive adhesive agent 23 and the reinforcing adhesive agent 24 are simultaneously cured at normal temperature or by heating.

By this procedure, the connector 10 is fixed to the housing 4.

When needed, a protective film such as an insulating layer or a conductive layer may be formed on the signal wirings 20 constructed by applying a conductive adhesive agent in a line form to the inner surface 14 of the bottom wall 4a.

Reinforced bonding may be performed by using the reinforcing adhesive agent 24 even when the connector 10 is mechanically incorporated in the housing 4 in advance. Even in this case, since the connector 10 and the housing 4 are bonded by the reinforcing adhesive agent 24, the reliability of fixing improves. Further, even if the connector 10 is fixed to the housing 4 by the conductive adhesive agent 23 in this case, more reliable fixing can be realized by performing reinforced bonding by using the reinforcing adhesive agent 24.

According to the present embodiment, by providing the connector 10 with the reinforcing pin 18 and bonding the reinforcing pin 18 and the housing 4 by the reinforcing adhesive agent 24, the connector 10 and the housing 4 can be fixed with higher reliability than when the connection terminals 12 of the connector 10 are connected to the housing 4 only by the conductive adhesive agent 23.

Next, a second embodiment will be described.

Second Embodiment

Figure 5:
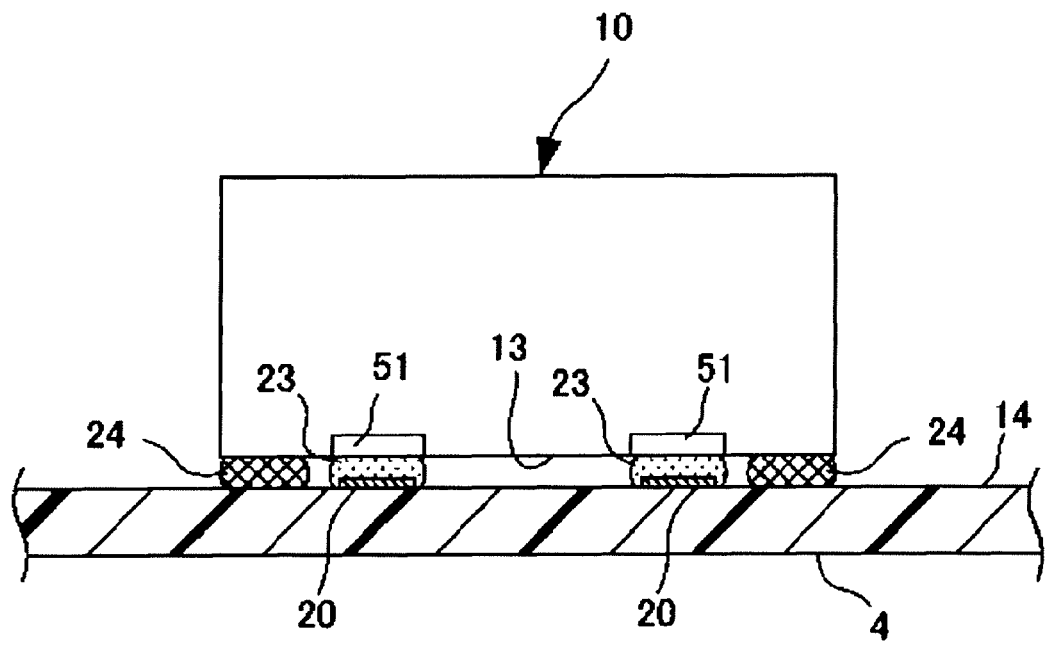
FIG. 5 is an exemplary sectional view showing a state the connector is bonded to the housing according to a second embodiment.

FIG. 5 discloses the second embodiment. The second embodiment is different from the first embodiment in that neither the connection terminals 12 nor the reinforcing pin 18 is provided but connection terminals 51 are provided on the lower surface 13 of the connector 10 and that the partitioning wall 17 is not provided on the inner surface 14 of the bottom wall 4a of the housing 4. Except for this, the basic structure of the portable computer 1 is substantially similar to that of the first embodiment. Therefore, in the second embodiment, parts having the same structures as those of the first embodiment are denoted by the same reference numerals and descriptions thereof are omitted.

The connection terminals 51 are flatly provided on the lower surface 13 of the connector 10, and do not protrude from the lower surface 13. The connection terminals 51 are directly bonded to the inner surface 14 of the housing 4 by the conductive adhesive agent 23, and are electrically connected to the signal wirings 20 as conductive members.

The connector 10 is fixed to the inner surface 14 of the bottom wall 4a by the reinforcing adhesive agent 24 in an area of the lower surface 13 where the connection terminals 51 are absent.

According to this structure, even when the end portions for electrical connection or physical fixing do not protrude from the connector 10, the connector 10 and the housing 4 can be fixed with high reliability while the connector 10 and the signal wirings 20 are electrically connected.

In this case, the housing 4 and the connector 10 can be connected by a procedure substantially similar to the connection procedure described in the first embodiment. That is, by supplying the conductive adhesive agent 23 and the reinforcing adhesive agent 24 before the connector 10 is mounted in the corresponding position in the housing 4, the conductive adhesive agent 23 and the reinforcing adhesive agent 24 can be simultaneously cured at normal temperature or by heating. By making the same the curing conditions of the conductive adhesive agent 23 with high electrical conduction effect and the reinforcing adhesive agent 24 for fixing reinforcement, after the supply of these adhesive agents, the curing of these adhesive agents at normal temperature or by heating can be simultaneously performed, so that manufacturing man-hours can be reduced. Moreover, fixing can be performed with higher reliability than when fixing is performed only by the conductive adhesive agent 23 and when fixing is performed only by the conductive adhesive agent 23 for a substantially similar curing time.

(Modification of Second Embodiment)

Figure 6:
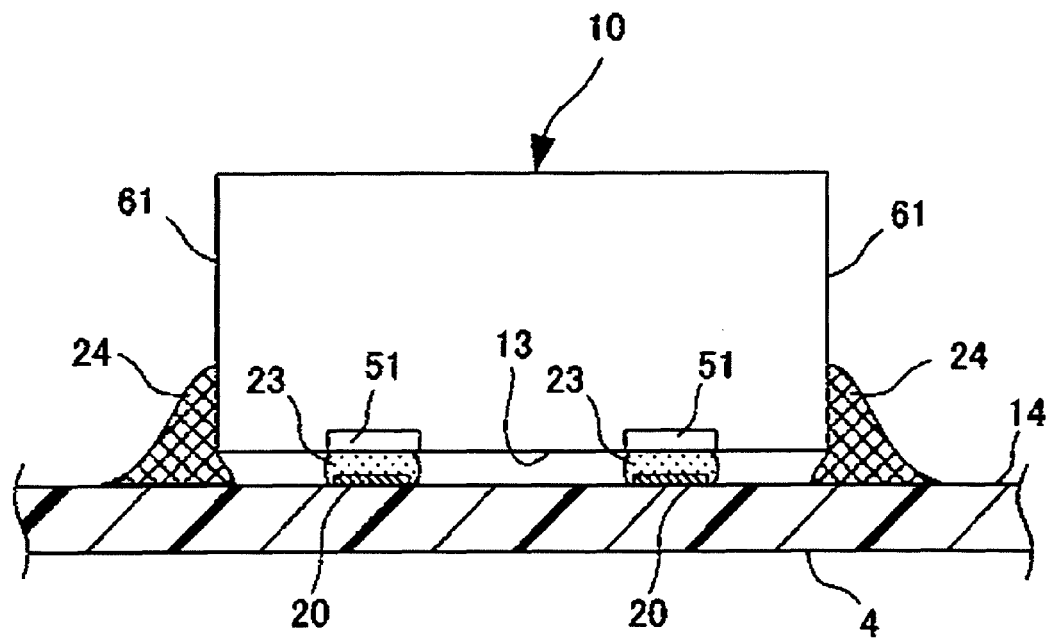
FIG. 6 is an exemplary sectional view showing a state the connector is bonded to the housing according to a modification of the second embodiment.

FIG. 6 discloses a modification of the second embodiment. The modification of the second embodiment is different from the second embodiment in the position of the reinforcing adhesive agent 24.

In this modification, the reinforcing adhesive agent 24 is not applied between the lower surface 13 of the connector 10 and the inner surface 14 but is applied to a side surface 61 of the connector 10. Like this, the reinforcing adhesive agent 24 may be applied so as to fix the side surface 61 of the connector 10 and the inner surface 14.

For example, even when the connector 10 and the housing 4 are fixed by the conductive adhesive agent 23 first, the reliability of fixing can be improved by applying the reinforcing adhesive agent 24 so as to fix the positional relationship between the side surface 61 and the inner surface 14.

While the housing is made of a synthetic resin in the first embodiment, it may be made of, for example, a metal such as magnesium or aluminum. When the housing is made of a metal, for example, the housing is provided with electrical insulation property by coating the inner surface of the housing with an insulating layer, and signal wirings are provided on the insulating layer.

While certain embodiments have been described, these embodiments have been presented by way of example only, and are not intended to limit the scope of the invention. Indeed, the novel apparatus described herein may be embodied in a variety of other forms; furthermore, various omissions, substitutions and changes in the form of the apparatus, described herein may be made without departing from the sprit of the invention. The accompanying claims and their equivalents are intended to cover such forms or modifications as would fall within the scope and sprit of the invention.

What is claimed is:

1. An electronic apparatus comprising:
 a housing;
 a signal wiring provided on a first surface which is an inner surface of the housing;
 an electronic component accommodated in the housing, the electronic component comprises (i) a conductive member for electrical continuity with the signal wiring, the conductive member formed on and protruding from a surface of the electronic component facing the first surface of the housing, and (ii) a reinforcing pin protruding from a position on the surface of the electronic component facing the first surface of the housing that is different from a position where the conductive member protrudes from the surface of the electronic component,
 wherein the electronic component is fixed to the first surface of the housing by (i) an conductive adhesive agent having conductivity so that the conductive member has electrically continuity with the signal wiring and (ii) a reinforcing adhesive agent having adhesive strength higher than the conductive adhesive agent, and
 wherein the reinforcing pin and the first surface of the housing are fixed by the reinforcing adhesive agent.

2. The apparatus of claim 1,
 wherein the housing comprises a protrusion protruding from the first surface of the housing toward the inside of the housing and surrounding the conductive member and the reinforcing pin, and
 wherein the conductive adhesive agent is filled in an area where the conductive member is surrounded by the protrusion, and the reinforcing adhesive agent is filled in an area where the reinforcing pin is surrounded by the protrusion.

3. The apparatus of claim 1, wherein the electronic component is a connector.

4. An electronic apparatus comprising:
 a housing;
 a signal wiring provided on a first surface which is an inner surface of the housing;
 an electronic component accommodated in the housing, the electronic component comprises a conductive member for electrical continuity with the signal wiring, the conductive member formed on and protruding from a surface of the electronic component facing the first surface of the housing, and a reinforcing pin protruding from a position on the surface of the electronic component facing the first surface of the housing that is different from a position where the conductive member protrudes, and, wherein the electronic component is fixed to the first surface of the housing by (i) a first adhesive agent so that the conductive member has electrically continuity with the signal wiring and (ii) a second adhesive agent having a property different from a property of the first adhesive agent, and wherein the reinforcing pin and the first surface of the housing are fixed by the reinforcing adhesive agent.

5. The apparatus of claim 4, wherein the housing comprises a protrusion protruding from the first surface of the housing toward the inside of the housing and surrounding the conductive member and the reinforcing pin, and wherein the first adhesive agent is filled in an area where the conductive member is surrounded by the protrusion, and the second adhesive agent is filled in an area where the reinforcing pin is surrounded by the protrusion.

6. An electronic apparatus comprising:
a housing comprising a protrusion provided on an inner surface;
a signal wiring provided on the inner surface of the housing;
an electronic component accommodated in the housing, the electronic component comprises (i) a conductive member for electrical continuity with the signal wiring, the conductive member protruding from a surface of the electronic component facing the inner surface of the housing, and (ii) a reinforcing pin protruding from a position different from a position, where the conductive member protrudes, of the surface of the electronic component facing the inner surface of the housing;
a conductive adhesive agent for electrical continuity between the conductive member and the signal wiring; and
a reinforcing adhesive agent provided at a position partitioned by the protrusion from an area where the conductive adhesive agent is provided, having adhesive strength higher than the conductive adhesive agent, and configured to fix the housing and the electronic component
wherein the reinforcing pin and the inner surface of the housing are fixed by the reinforcing adhesive agent.

7. An electronic apparatus comprising:
a housing comprising a protrusion provided on an inner surface;
a signal wiring provided on the inner surface of the housing;
an electronic component accommodated in the housing and comprising a conductive member for electrical continuity with the signal wiring;
a conductive adhesive agent for electrical continuity between the conductive member and the signal wiring; and
a reinforcing adhesive agent provided at a position partitioned by the protrusion from an area where the conductive adhesive agent is provided, having adhesive strength higher than the conductive adhesive agent, and configured to fix the housing and the electronic component wherein the conductive adhesive agent is filled in an area where the conductive member is surrounded by the protrusion, and the reinforcing adhesive agent is filled in an area where the reinforcing pin is surrounded by the protrusion.

8. The apparatus of claim 7, wherein the electronic component comprises a surface being different from the surface facing the inner surface of the housing and this surface and the inner surface of the housing are fixed by the reinforcing adhesive agent.

9. The apparatus of claim 7, wherein the electronic component is a connector.

10. An electronic apparatus comprising:
a housing comprising a protrusion provided on an inner surface;
a signal wiring provided on the inner surface of the housing;
an electronic component accommodated in the housing, the electronic component is a connector disposed at an opening of a side wall of the housing, and the connector comprises a plurality of connection terminals and a reinforcing pin;
a first adhesive agent configured to electrically connect the electronic component and the signal wiring; and
a second adhesive agent configured to connect the housing and the electronic component at a position of sandwiching the protrusion with the first adhesive agent.

11. The apparatus of claim 10, wherein the reinforcing pin protrudes from the connector and is configured to reinforce a fixing between the connector and the housing, and is provided on a side closer to the opening than the connection terminals in the connector disposed inside the housing.

12. The apparatus of claim 10, wherein the connection terminals and the reinforcing pin are arranged in a matrix form on a flat lower surface of the connector, and the connection terminals protrude from the connector and are configured to be electrically connected to the signal wiring as conductive members.

13. The apparatus of claim 10, wherein the housing is made of a synthetic resin material and comprises electrical insulation property, and the housing comprises a flat box shape comprising a bottom wall, an upper wall and the side wall.

14. The apparatus of claim 10, further comprising a display module.

15. An electronic apparatus comprising:
a housing comprising a connector and a protrusion provided on an inner surface, the protrusion is a partitioning wall, the partitioning wall comprises a plurality of wiring lead-in portions, the wiring lead-in portions comprises a slit form opened to adhesive filling portions corresponding to connection terminals of the connector, and in positions corresponding to the wiring lead-in portions, an inner surface of a bottom wall of the housing is exposed;
a signal wiring provided on the inner surface of the housing;
a first adhesive agent configured to electrically connect the connector and the signal wiring; and
a second adhesive agent configured to connect the housing and the connector at a position of sandwiching the protrusion with the first adhesive agent.

* * * * *